United States Patent
Lee et al.

(10) Patent No.: US 9,307,632 B2
(45) Date of Patent: Apr. 5, 2016

(54) MULTILAYERED SUBSTRATE AND METHOD OF MANUFACTURING THE SAME

(71) Applicant: SAMSUNG ELECTRO-MECHANICS CO., LTD., Suwon (KR)

(72) Inventors: Doo Hwan Lee, Daejeon (KR); Ho Shik Kang, Yeongi-gun (KR); Yee Na Shin, Suwon (KR); Yul Kyo Chung, Yongin (KR); Seung Eun Lee, Sungnam (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 129 days.

(21) Appl. No.: 14/143,527

(22) Filed: Dec. 30, 2013

(65) Prior Publication Data

US 2014/0182895 A1      Jul. 3, 2014

(30) Foreign Application Priority Data

Dec. 31, 2012   (KR) .................. 10-2012-0157886
Nov. 13, 2013   (KR) .................. 10-2013-0137665

(51) Int. Cl.
*H05K 1/02*   (2006.01)
*H05K 3/30*   (2006.01)
*H05K 3/46*   (2006.01)
(Continued)

(52) U.S. Cl.
CPC ............. *H05K 1/0271* (2013.01); *H01L 24/18* (2013.01); *H05K 1/185* (2013.01); *H05K 3/4688* (2013.01); *H01L 2224/12105* (2013.01); *H01L 2224/73267* (2013.01); *H05K 3/0097* (2013.01); *H05K 3/4682* (2013.01); *H05K 2201/0175* (2013.01); *H05K 2201/068* (2013.01); *H05K 2203/0152* (2013.01); *H05K 2203/1572* (2013.01); *Y10T 29/4913* (2015.01); *Y10T 29/49155* (2015.01)

(58) Field of Classification Search
CPC ......... H05K 1/0271; H05K 3/46; H05K 3/30; H05K 1/0298
USPC .............................. 174/251, 260; 29/846, 832
See application file for complete search history.

(56) References Cited

U.S. PATENT DOCUMENTS 5,353,498 A     10/1994  Fillion et al.
6,372,999 B1 *   4/2002  Bjorndahl et al. ............ 174/262
(Continued)

FOREIGN PATENT DOCUMENTS

JP      59050756    *  3/1984   ............. H02K 15/12
JP      04-283987      10/1992
(Continued)

OTHER PUBLICATIONS

Korean Office Action dated Nov. 21, 2014 in corresponding Korean Patent Application No. 10-2013-0137665.
(Continued)

*Primary Examiner* — Timothy Thompson
*Assistant Examiner* — Charles Pizzuto
(74) *Attorney, Agent, or Firm* — NSIP Law

(57) ABSTRACT

A multilayered substrate and a method of manufacturing the same. The multilayered substrate includes a plurality of wiring layers and reinforcing layers disposed at the outermost portions of both surfaces of the multilayered substrate, respectively, in order to decrease warpage of the multilayered substrate and has wiring patterns optimized depending on a scheme in which external electrodes are formed on an electronic component.

21 Claims, 16 Drawing Sheets

(51) Int. Cl.
*H05K 1/18* (2006.01)
*H01L 23/00* (2006.01)
*H05K 3/00* (2006.01)

(56) References Cited

U.S. PATENT DOCUMENTS

| | | | |
|---|---|---|---|
| 2003/0207155 A1* | 11/2003 | Morrison et al. | 428/699 |
| 2007/0044303 A1* | 3/2007 | Yamano | 29/830 |
| 2008/0011507 A1 | 1/2008 | Vasoya | |
| 2010/0319966 A1 | 12/2010 | Liu | |
| 2011/0121445 A1* | 5/2011 | Mori et al. | 257/693 |
| 2012/0006469 A1* | 1/2012 | Inagaki et al. | 156/182 |
| 2012/0241202 A1 | 9/2012 | Vasoya | |
| 2013/0118680 A1* | 5/2013 | Liu | 156/247 |

FOREIGN PATENT DOCUMENTS

| | | | |
|---|---|---|---|
| JP | 2000-261124 | | 9/2000 |
| JP | 2001126767 | * | 5/2001 |
| JP | 3838250 | * | 10/2006 |
| JP | 2009-218545 | | 9/2009 |
| KR | 101043328 | * | 6/2011 |
| KR | 10-2011-0100981 | | 9/2011 |
| KR | 10-1067109 | | 9/2011 |
| TW | 200913810 A1 | | 3/2009 |
| TW | 201028065 A1 | | 7/2010 |
| TW | 201101441 A1 | | 1/2011 |

OTHER PUBLICATIONS

Office Action mailed Mar. 6, 2015 for corresponding Taiwanese Patent Application No. 102144517.

* cited by examiner

MULTILAYERED SUBSTRATE AND METHOD OF MANUFACTURING THE SAME

CROSS REFERENCE(S) TO RELATED APPLICATIONS

This application claims the foreign priority benefit under 35 U.S.C. Section 119 of Korean Patent Application Serial Nos. 10-2012-0157886 and 10-2013-0137665, filed on Dec. 31, 2012 and Nov. 13, 2013 in the Korean Intellectual Property Office, entitled "Multilayered Substrate and Method of Manufacturing the Same", the disclosure of which is hereby incorporated by reference in its entirety.

BACKGROUND

1. Technical Field

Embodiments of the present invention relate to a multilayered substrate and a method of manufacturing the same.

2. Description of the Related Art

In accordance with a trend toward lightness, miniaturization, an increase in a speed, multi-functionization, and improvement in performance of electronic devices, multilayered substrate technologies in which a plurality of wiring layers are formed on a printed circuit board (PCB) have been developed. Further, technologies in which electronic components such as active elements, passive elements, or the like, are embedded in a multilayered substrate have also been developed.

For example, Patent Document 1 has disclosed a printed circuit board including electronic components inserted into cavities and a plurality of layers, and a method of manufacturing the same.

Meanwhile, one of important subjects in a multilayered substrate field is to allow an embedded electronic component to efficiently transmit and receive signals including a voltage or a current to and from external circuits or other devices.

In addition, as a trend toward improvement in performance of an electronic component and miniaturization and thinness of the electronic component and an electronic component embedded substrate has been recently intensified, it should be necessary to improve a degree of integration of circuit patterns in order to embed a small electronic component in a thin and narrow substrate and connect an external electronic of the electronic component to the outside.

Meanwhile, as the electronic component embedded substrate has been thinned, a warpage phenomenon of the substrate has become a serious problem. The warpage phenomenon is also called warpage. As the electronic component embedded substrate has been made of various materials having different coefficients of thermal expansion, the warpage of the substrate has been intensified.

According to the related art, a method of forming an insulating layer using a material having high rigidity has been used in order to decrease the warpage of the substrate. However, in the case of forming the insulating layer using only the material having high rigidity, since a surface of the insulating layer is rough, there was a limitation in improving a degree of integration of wiring patterns formed on the insulating layer.

In addition, Patent Document 2 has disclosed a technology in which electronic components are embedded on one side of a core substrate and a circuit pattern layer and an insulating layer are built up only in a single direction in order to secure mechanical strength, and Patent Document 3 has disclosed a technology in which a capacitor is disposed at the center of a core substrate and a circuit pattern layer and an insulating layer are built up in both directions.

However, technologies according to the related art including the technologies disclosed in Patent Document 1 to 4, and the like, in which structures and methods that may be implemented in a technology level at that time at which the technologies were developed are universally applied to all electronic components, were not structures optimized based on a role and complexity of each of the electronic components embedded in the board. Therefore, there was a limitation to improve the degree of integration of the wiring patterns while decreasing the warpage phenomenon.

RELATED ART DOCUMENT

Patent Document (Patent Document 1) US Patent Application Publication No. 2012-0006469

(Patent Document 2) U.S. Pat. No. 5,353,498

(Patent Document 3) Japanese Patent Laid-Open Publication No. 2000-261124

(Patent Document 4) Japanese Patent Laid-Open Publication No. 1992-283987

SUMMARY

An object of embodiments of the present invention is to provide a technology capable of decreasing warpage.

Another object of embodiments of the present invention is to provide a technology capable of decreasing warpage while improving a degree of integration of wiring patterns in consideration of characteristics of electronic components.

According to an exemplary embodiment of the present invention, there is provided a multilayered substrate including: a plurality of wiring layers; and reinforcing layers disposed at the outermost portions of both surfaces of the multilayered substrate, respectively, in order to decrease warpage of the multilayered substrate.

The reinforcing layers may be made of a material having a coefficient of thermal expansion of 11 ppm/° C. or less.

The reinforcing layers may be made of a material having an elastic modulus of 25 GPa or more.

The reinforcing layers may be made of a glass material.

The reinforcing layer disposed at the outermost portion of one surface of the multilayered substrate may be a first reinforcing layer, the reinforcing layer disposed at the outermost portion of the other surface of the multilayered substrate may be a second reinforcing layer, and the multilayered substrate may further include a first insulating layer disposed between the first and second reinforcing layers, wherein the first insulating layer includes an electronic component having an external electrode and a cavity into which at least a portion of the electronic component is inserted.

The multilayered substrate may further include a solder resist covering at least a portion of at least one of one surface of the first reinforcing layer and the other surface of the second reinforcing layer.

The multilayered substrate may further include a third circuit pattern layer disposed on a lower surface of the first reinforcing layer; and a second insulating layer disposed between the first reinforcing layer and the first insulating layer, wherein the second insulating layer contacts the lower surface of the first reinforcing layer and the third circuit pattern layer.

The multilayered substrate may further include a third insulating layer disposed between the first insulating layer and the second reinforcing layer, wherein the third insulating layer includes a fourth circuit pattern layer disposed on a portion of a surface thereof and contacting the second reinforcing layer.

The third insulating layer may include: a third upper insulating layer contacting the first insulating layer and a surface of the electronic component and having a fifth circuit pattern layer disposed on a lower surface thereof; and a third lower insulating layer having one surface contacting the fourth circuit pattern layer and the second reinforcing layer.

The multilayered substrate may further include a fifth via penetrating through the second insulating layer, the first insulating layer, and the third upper insulating layer and directly connecting at least one circuit pattern of the third circuit pattern layer and at least one circuit pattern of the fifth circuit pattern layer to each other.

The multilayered substrate may further include a third via penetrating through the third upper insulating layer and directly connecting at least one circuit pattern of the fifth circuit pattern layer and the external electrode to each other.

According to another exemplary embodiment of the present invention, there is provided a method of manufacturing a multilayered substrate, including: forming reinforcing layers at the outermost portions of both surfaces of the multilayered substrate including a plurality of wiring layers, wherein the reinforcing layers are made of a material satisfying at least one of a condition in which a coefficient of thermal expansion is 11 ppm/° C. or less and a condition in which an elastic modulus is 25 GPa or more.

The reinforcing layers may be made of a glass material.

According to still another exemplary embodiment of the present invention, there is provided a method of manufacturing a multilayered substrate, including: mounting an electronic component on a first reinforcing layer having a third circuit pattern layer formed on one surface thereof, the electronic component having an external electrode; forming a second insulating layer on the first reinforcing layer, the second insulating layer covering the third circuit pattern layer and the first reinforcing layer and contacting a side of the electronic component; stacking a first insulating layer on the second insulating layer, the first insulating layer having a cavity into which at least a portion of the electronic component is inserted; forming a third upper insulating layer on the first insulating layer, the third upper insulating layer covering the electronic component and the first insulating layer and being filled between the cavity and the electronic component; forming a fifth circuit pattern layer on the third upper insulating layer, the fifth circuit pattern layer having at least one circuit pattern directly connected to the external electrode by a third via; forming a third lower insulating layer on the third upper insulating layer, the third lower insulating layer covering the fifth circuit pattern layer and the third upper insulating layer; forming a fourth circuit pattern layer on the third lower insulating layer, the fourth circuit pattern layer having at least one circuit pattern directly connected to at least one circuit pattern of the fifth circuit pattern layer by a fourth via; and forming a second reinforcing layer on the third lower insulating layer, the second reinforcing layer covering the fourth circuit pattern layer and the third lower insulating layer, wherein the first and second reinforcing layers decrease warpage of the multilayered substrate.

The first and second reinforcing layers may be made of a material satisfying at least one of a condition in which a coefficient of thermal expansion is 11 ppm/° C. or less and a condition in which an elastic modulus is 25 GPa or more.

The first and second reinforcing layers may be made of a glass material.

The first reinforcing layers may be formed on upper and lower surfaces of a detached core, respectively, and be separated from the detached core after the method is performed in each of directions toward upper and lower surfaces based on the detached core.

The third upper insulating layer and the third lower insulating layer may be formed by hardening a fluid synthetic resin that does not contain a core material.

The second insulating layer may be formed by hardening a fluid synthetic resin that contains a core material.

The forming of the fifth circuit pattern layer on the third upper insulating layer may include forming a fifth via directly connecting at least one circuit pattern of the fifth circuit pattern layer to at least one circuit pattern of the third circuit pattern layer.

BRIEF DESCRIPTION OF THE DRAWINGS

FIG. 6B schematically shows the state in which a first reinforcing layer and a third metal layer are formed; FIG. 6C schematically shows the state in which a third circuit pattern layer is formed by patterning the third metal layer; FIG. 6D schematically shows the state in which an electronic component is coupled onto the third circuit pattern layer; FIG. 6E schematically shows the state in which a second insulating layer, a first insulating layer, and a third upper insulating layer are formed; FIG. 6F schematically shows the state in which a third via, a fifth via, and a fifth circuit pattern layer are formed; FIG. 6G schematically shows the state in which a third lower insulating layer, a fourth circuit pattern layer, and a second reinforcing layer are formed; FIG. 6H schematically shows the state in which the detached core is removed; FIG. 6I schematically shows the state in which a first circuit pattern layer and a second circuit pattern layer are formed; FIG. 6J schematically shows the state in which solder resists are formed; and FIG. 6K schematically shows the state in which solder balls are formed; FIG. 7B schematically shows the state in which first reinforcing layers and third metal layers are formed above and below the detached core, respectively; FIG. 7C schematically shows the state in which third circuit pattern layers are formed by patterning the third metal layers formed above and below the detached core, respectively; FIG. 7D schematically shows the state in which electronic components are coupled onto the third circuit pattern layers formed above and below the detached core, respectively; FIG. 7E schematically shows the state in which second insulating layers, first insulating layers, and third upper insulating layers are formed above and below the detached core, respectively; FIG. 7 F schematically shows the state in which third vias, fifth vias, and fifth circuit pattern layers are formed above and below the detached core, respectively; FIG. 7G schematically shows the state in which third lower insulating layers, fourth circuit pattern layers, and second reinforcing layers are formed above and below of the detached core, respectively; FIG. 7H schematically shows the state in which the detached core is removed; FIG. 7I schematically shows the state in which a first circuit pattern layer and a second circuit pattern layer are formed at a portion that has been positioned below the detached core; FIG. 7J schematically shows the state in which solder resists are formed; and FIG. 7J schematically shows the state in which solder balls are formed.

DESCRIPTION OF EMBODIMENTS

Figure 1:
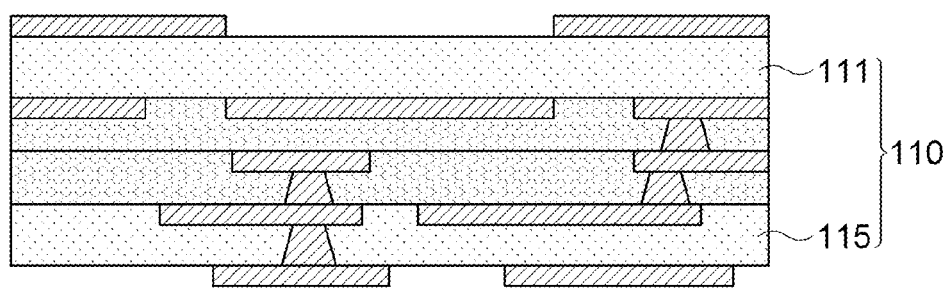
FIG. 1 is a cross-sectional view schematically showing a multilayered substrate according to an exemplary embodiment of the present invention.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Like reference numerals throughout the description denote like elements.

Terms used in the present specification are for explaining exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an acting effect of exemplary embodiments of the present invention will be described in more detail with reference to the accompanying drawings.

FIG. 1 is a cross-sectional view schematically showing a multilayered substrate 100 according to an exemplary embodiment of the present invention.

Referring to FIG. 1, the multilayered substrate 100 according to the exemplary embodiment of the present invention is configured to include a plurality of wiring layers and reinforcing layers 110 disposed on the outermost layers of one side and the other side thereof, respectively.

That is, a first reinforcing layer 111 may be disposed on a layer positioned at the outermost portion of one side of the multilayered substrate 100, and a second reinforcing layer 115 may be disposed on a layer positioned at the outermost portion of the other side of the multilayered substrate 100.

In addition, at least one circuit pattern layer and insulating layer may be disposed between the first and second reinforcing layers 111 and 115.

Figure 2:
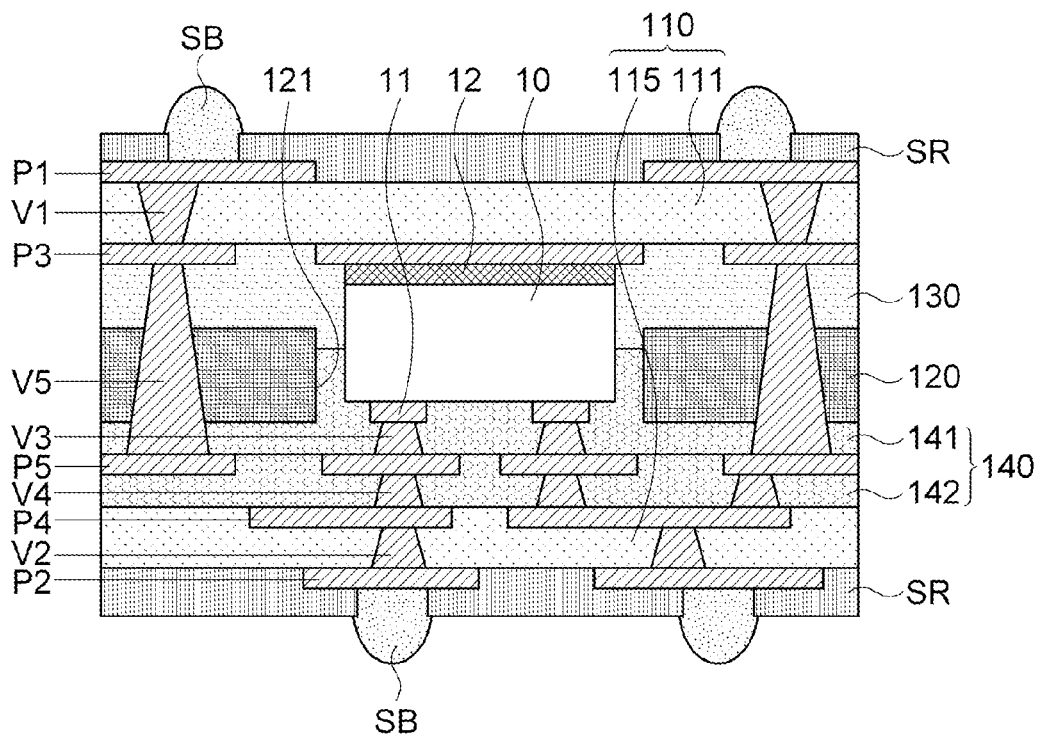
FIG. 2 is a cross-sectional view schematically showing a multilayered substrate according to another exemplary embodiment of the present invention.

FIG. 2 is a cross-sectional view schematically showing a multilayered substrate 200 according to another exemplary embodiment of the present invention.

Referring to FIG. 2, the multilayered substrate 200 according to the exemplary embodiment of the present invention may include an electronic component 10 embedded therein.

The electronic component 10 may be an active element such as a semiconductor chip, or the like, or a passive element such as a capacitor, or the like, and may include an external electrode 11 (or external terminal) formed on an outer portion thereof in order to be electrically connected to other devices.

Here, the electronic component 10 may be positioned in a first insulating layer 120 disposed between first and second reinforcing layers 111 and 115. Particularly, a cavity 121 may be disposed in the first insulating layer 120, and at least a portion of the electronic component 10 may be inserted into the cavity 121.

In addition, the multilayered substrate 200 may further include a second insulating layer 130 disposed between the first insulating layer 120 and the first reinforcing layer 111.

Here, the first reinforcing layer 111 may include a third pattern layer P3 disposed on a lower surface thereof. As shown in FIG. 2, the electronic component 10 may be fixed to any one circuit pattern of the third circuit pattern layer P3. In this case, an adhesive 12 may be disposed between the electronic component 10 and the circuit pattern to contribute to fixing the electronic component 10.

In addition, the multilayered substrate 200 may further include a third insulating layer 140 disposed between the first insulating layer 120 and the second reinforcing layer 115.

Here, the third insulating layer 140 may include a third upper insulating layer 141 and a third lower insulating layer 142.

The third upper insulating layer 141 may cover a lower surface of the first insulating layer 120 and the electronic component 10 and may include a fifth circuit pattern layer P5 disposed on a lower surface thereof.

In addition, the third lower insulating layer 142 may cover a lower surface of the third upper insulating layer 141 and the fifth circuit pattern layer P5 and may include a fourth circuit pattern layer P4 formed on a lower surface thereof.

Here, the electronic component 10 may include an external electrode 11 disposed on a lower surface thereof, and a third via V3 penetrating through the third upper insulating layer 141 may be directly connected between any one circuit pattern of the fifth circuit pattern layer P5 and the external electrode 11.

In addition, any one circuit pattern of the fifth circuit pattern layer P5 and any one circuit pattern of the fourth circuit pattern layer P4 may be directly connected to each other by a fourth via V4 penetrating through the third lower insulating layer 142.

Here, the fifth circuit pattern layer P5 directly connected to the external electrode 11 of the electronic component 10 by the third via V3 and the fourth circuit pattern layer P4 directly connected to the fifth circuit pattern layer P5 by the fourth via V4 may require a wiring density higher than those of other circuit pattern layers.

Generally, insulating materials including a glass fiber as a core material to increase rigidity are used in order to decrease warpage. However, in a circuit pattern formed on a surface of an insulating layer including the core material as described above, there is a limitation in making a line width and a pitch fine. Further, even in the case of forming a via in the insulating layer including the core material, there is a limitation in decreasing a diameter of the via.

Therefore, it is preferable to use a material that does not contain the core material such as the glass fiber, or the like, in implementing the third upper insulating layer 141 and the third lower insulating layer 142.

In addition, the second reinforcing layer 115 may include a second circuit pattern layer P2 disposed on a lower surface thereof, and any one circuit pattern of the second circuit pattern layer P2 and any one circuit pattern of the fourth circuit pattern layer P4 may be directly connected to each other by a second via V2 penetrating through the second reinforcing layer 115.

Meanwhile, the first reinforcing layer 111 may include a first circuit pattern layer P1 disposed on an upper surface thereof, and any one circuit pattern of the first circuit pattern layer P1 and any one circuit pattern of the third circuit pattern layer P3 may be directly connected to each other by a first via V1 penetrating through the first reinforcing layer 111.

In addition, any one circuit pattern of the fifth circuit pattern layer P5 and any one circuit pattern of the third circuit pattern layer P3 may be directly connected to each other by a fifth via V5 penetrating through the third upper insulating layer 141, the first insulating layer 120, and the second insulating layer 130.

All of the electronic components embedded in the multilayered substrate do not have the same complexity. In addition, external electrodes of an electronic component package may also be formed to be directed toward a specific direction. Therefore, in this case, complex wirings are maintained only in a direction toward which the external electrodes are directed, thereby making it possible to improve manufacturing efficiency of the multilayered substrate.

That is, in the case in which the external electrode 11 is formed only on the lower surface of the electronic component 10 as shown in FIG. 2, relatively fine patterns need to be disposed at a relatively high degree of integration in a direction toward the third insulating layer 140 corresponding to a direction in which the external electrode 11 is formed, in order to connect the external electrode 11 to the outside of the multilayered substrate 100.

As described above, the multilayered substrate 200 is formed so that a wiring density is relatively high in one direction and is relatively low in the other direction, based on a horizontal central axis of the multilayered substrate 200, thereby making it possible to improve manufacturing efficiency of the multilayered substrate 200.

However, in the case in which the multilayered substrate 200 is formed to have an asymmetric degree of circuit integration as described above, a warpage phenomenon may be intensified. In the exemplary embodiment of the present invention, the multilayered substrate 200 includes the first and second reinforcing layers 111 and 115, thereby making it possible to decrease the above-mentioned warpage phenomenon.

In addition, as shown in FIG. 2, the third circuit pattern layer P3 positioned over the upper surface of the electronic component 10 on which the electronic electrode 11 is not formed may have a wiring density relatively lower and a pattern width less fine as compared with the fifth circuit pattern layer P5 or the fourth circuit pattern layer P4.

Meanwhile, an insulating material that contains the core material such as the glass fiber, or the like, may be advantageous for decreasing the warpage due to high rigidity, but has a rough surface due to the core material, such that there is a limitation in forming fine patterns or decreasing a pattern pitch.

On the other hand, an insulating material that does not contain the core material such as the glass fiber, or the like, may make surface patterns relatively fine and further decrease a pattern pitch, but has insufficient rigidity, such that the warpage is increased.

In consideration of the above-mentioned situation, in the multilayered substrate 100 according to the exemplary embodiment of the present invention, the third insulating layer 140 formed below the external electrode 11 of the electronic component 10 is implemented by hardening a fluid synthetic resin that does not contain the core material so that circuit patterns are provided at a relatively high wiring density, and the second insulating layer 130 formed above the electronic component 10 is implemented by a fluid synthetic resin that contains the core material so as to have relatively high rigidity.

In addition, the first and second reinforcing layers 111 and 115 are disposed at the outermost layers of the multilayered substrate 100 so as to be symmetrical to each other, thereby making it possible to further decrease the warpage phenomenon.

Meanwhile, as shown in FIG. 2, the multilayered substrate 200 may further include solder resists SR covering the first reinforcing layer 111, the first circuit pattern layer P1, the second reinforcing layer 115, and the second circuit pattern layer P2. In addition, the multilayered substrate 200 may further include solder balls SB contacting the first and second circuit pattern layers P1 and P2 and exposed to the outside of the solder resists SR.

The solder resist SR may be selectively included in the multilayered substrate 200 if necessary. Therefore, it may be understood that terms 'the outermost portions' of both surfaces of the multilayered substrate 200 used in the present specification means the outermost portions in the state in which the solder resists SR are excluded.

Figure 3:
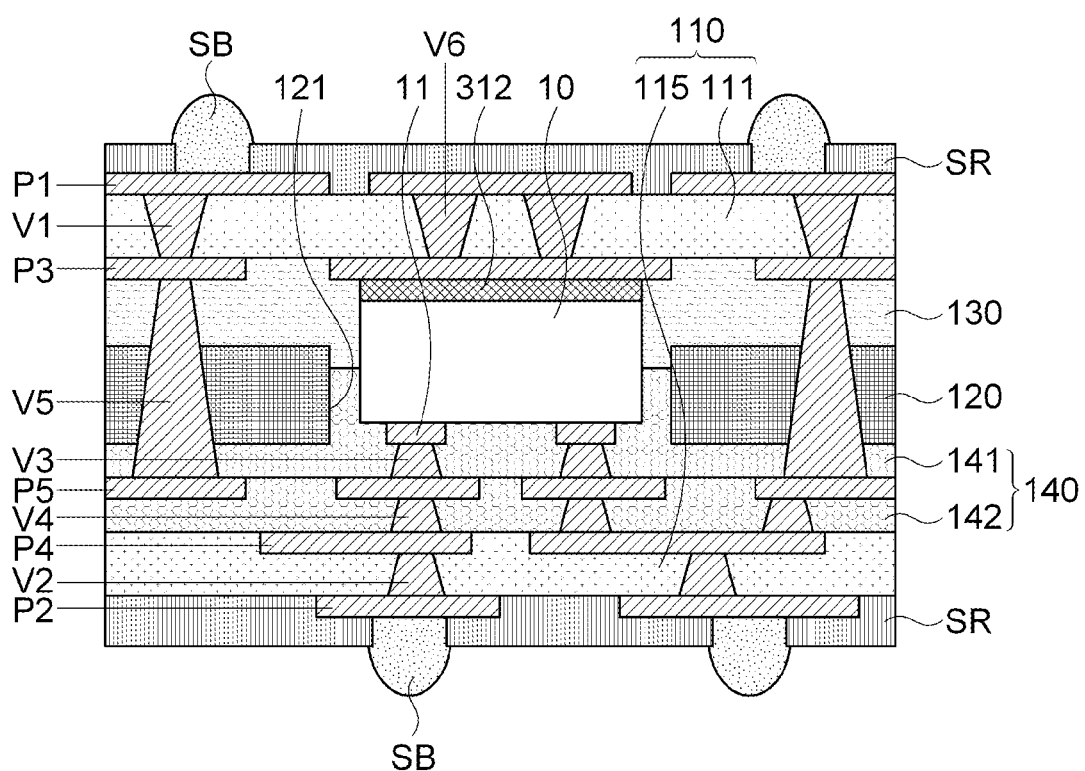
FIG. 3 is a cross-sectional view schematically showing a modified example of FIG. 2.
Figure 4:
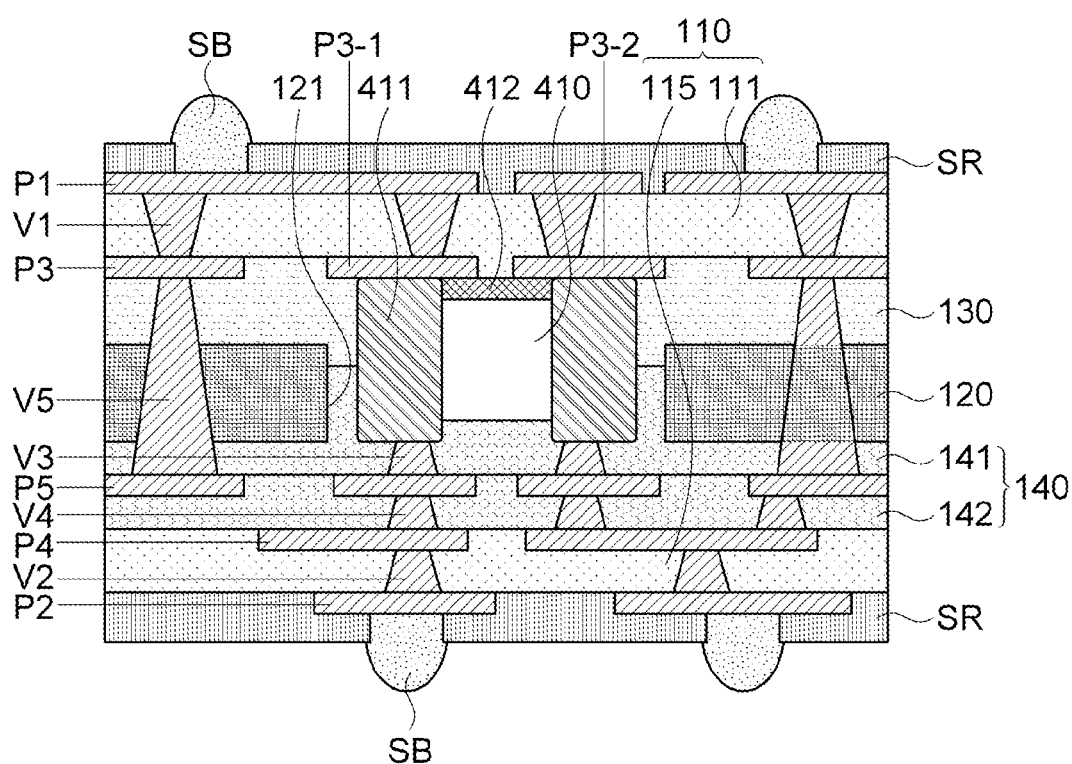
FIG. 4 is a cross-sectional view schematically showing another modified example of FIG. 2.

FIGS. 3 and 4 are cross-sectional views schematically showing modified examples of FIG. 2.

Referring to FIGS. 3 and 4, in the case in which it is required to efficiently radiate heat of an electronic component 10, a heat radiation adhesive 312 is applied onto an upper surface of the electronic component 10 to allow the electronic component 10 to be adhered to any one circuit pattern of a third circuit pattern P3, and a sixth via V6 is formed between the circuit pattern and any one circuit pattern of a first circuit pattern layer P1, thereby making it possible to allow heat generated from the electronic component 10 to be rapidly discharged to the outside through the heat radiation adhesive 312, any one circuit pattern of the third circuit pattern layer P3, the sixth via V6, and any one circuit pattern of the first circuit pattern layer P1.

In addition, in the case in which an electronic component 410 is a capacitor such as a multilayer ceramic capacitor (MLCC), or the like, having two external electrodes 411, first and second additional circuit patterns P3-1 and P3-2 maintained in the state in which they are electrically insulated from each other may be included in a third circuit pattern layer P3, wherein the first additional circuit pattern P3-1 may contact one external electrode 411 of the electronic component 410 and the second additional circuit pattern P3-2 may contact the other external electrode 411.

Here, a non-conductive adhesive 412 may be disposed between a portion of the electronic component 410 other than the external electrodes 411 and the first and second additional circuit patterns P3-1 and P3-2 to allow the electronic component 410 to be stably fixed.

In addition, each of the first and second additional circuit patterns P3-1 and P3-2 may be electrically connected to any one circuit pattern and the other circuit pattern of the first circuit pattern layer P1 through vias.

Figure 5:
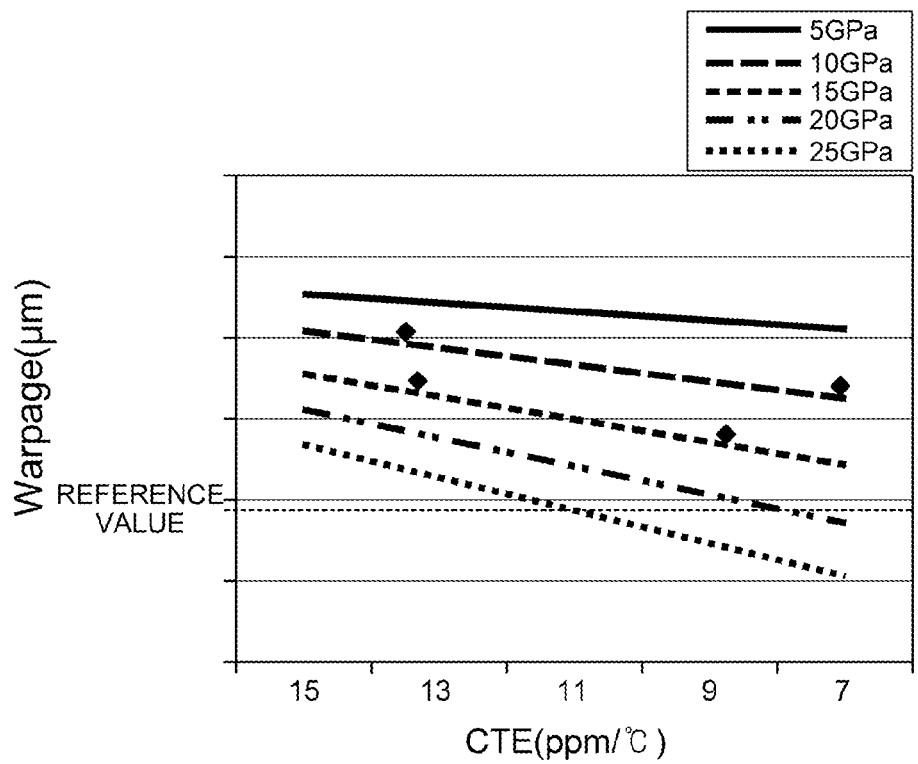
FIG. 5 is a graph schematically showing results obtained by measuring warpage while changing a coefficient of thermal expansion and an elastic modulus of a reinforcing layer in the multilayered substrate according to the exemplary embodiment of the present invention.

FIG. 5 is a graph schematically showing results obtained by measuring warpage while changing a coefficient of thermal expansion and an elastic modulus of a reinforcing layer 110 in the multilayered substrate 200 according to the exemplary embodiment of the present invention.

Here, FIG. 5 shows results obtained by measuring a distance from the lowest point to the highest point of one surface of the multilayered substrate 200 after heating the multilayered substrate 200 as shown in FIG. 2 configured to include the first reinforcing layer 111 having a thickness of 20 to 25 μm, the second insulating layer 130 having a thickness of 10 to 20 μm, the first insulating layer 120 having a thickness of 50 to 70 μm, the third insulating layer 140 having a thickness of 40 to 50 μm, and the second reinforcing layer 115 having a thickness of 20 to 25 μm and have the entire size of 14×14 mm to 260° C. and cooling the multilayered substrate 200 to a room temperature.

In FIG. 5, actually measured data are represented by a rhombus, and data represented in a linear shape indicate simulation results.

As shown in FIG. 5, in it was confirmed that the case in which a coefficient of thermal expansion of the reinforcing layer 110 is 11 ppm/° C. or less or in the case in which an elastic modulus of the reinforcing layer 110 is 25 GPa or more, warpage of a reference value or less was generated.

Here, it is to be noted that the reference value may be changed in the above-mentioned experimental conditions and an allowable range of warpage required in a product to which the multilayered substrate 200 is applied.

Meanwhile, an example of a material satisfying these conditions may include a glass material. Therefore, the first and second reinforcing layers 111 and 115 may be made of the glass material.

The glass material generally has an elastic modulus of 40 to 60 GPa and a coefficient of thermal expansion of 5 ppm/° C. or less. Therefore, the first and second reinforcing layers 111 and 115 are made of the glass material, thereby making it possible to significantly decrease the warpage.

FIGS. 6A to 6K are views schematically showing processes of a method of manufacturing a multilayered substrate according to the exemplary embodiment of the present invention.

Figure 6A:
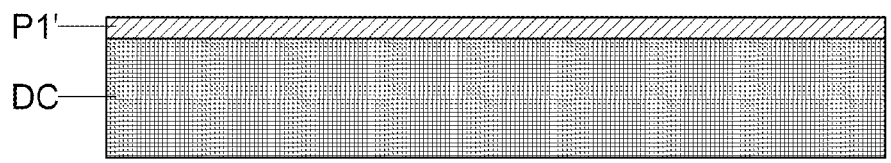
FIGS. 6A to 6K are cross-sectional views schematically showing processes of a method of manufacturing a multilayered substrate according to the exemplary embodiment of the present invention, wherein FIG. 6A schematically shows the state in which a detached core including a first metal core is provided.

First, referring to FIG. 6A, a detached core DC including a first metal layer P1' is provided.

Figure 6B:
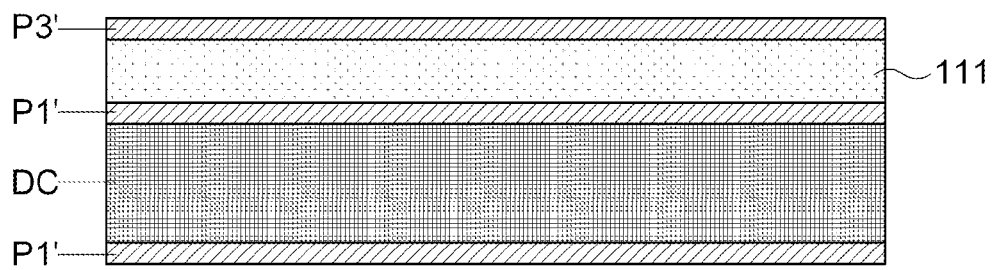

Next, referring to FIG. 6B, a first reinforcing layer 111 is formed on an upper surface of the first metal layer P1'. Here, the first reinforcing layer 111 may be coupled onto the first metal layer P1' in the state in which it includes a third metal layer P3' disposed on an upper surface thereof, but is not limited thereto.

Figure 6C:
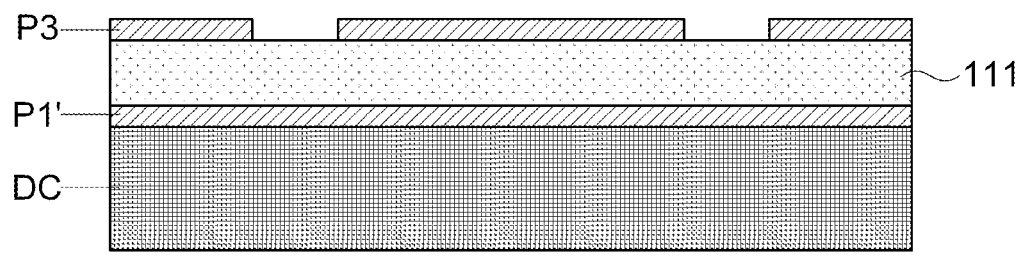
Figure 6D:
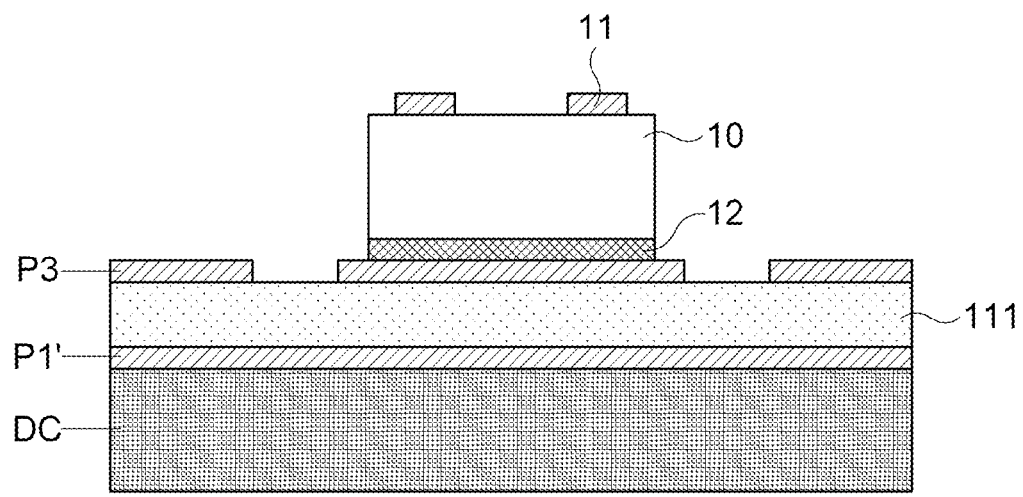

Then, referring to FIGS. 6C and 6D, the third metal layer P3' is patterned to form a third circuit pattern layer P3, and an electronic component 10 is coupled onto the third circuit pattern layer P3. Here, an adhesive 12 may be disposed on a lower surface of the electronic component 10 to allow the electronic component 10 to be stably fixed.

Figure 6E:
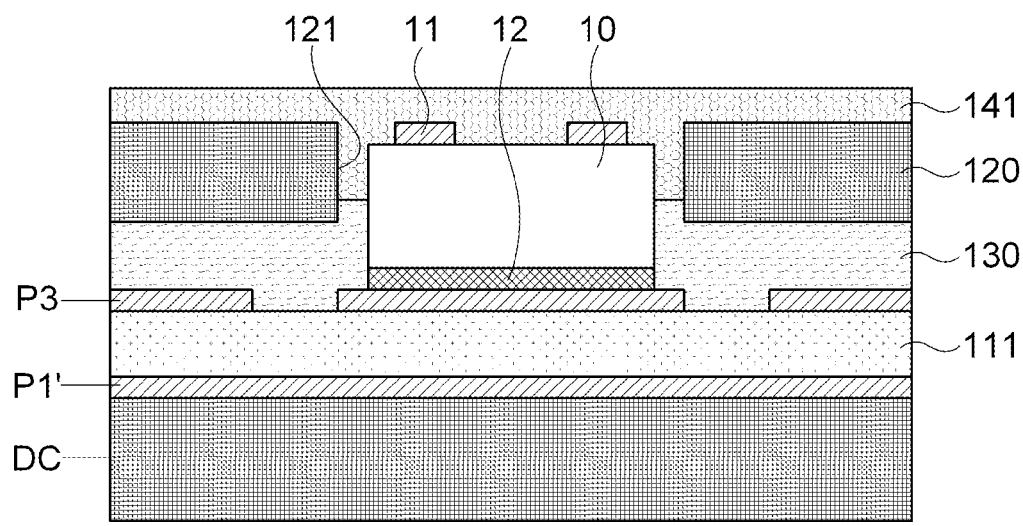

Next, referring to FIG. 6E, a second insulating layer 130 covering the third circuit pattern layer P3 and the first reinforcing layer 111 may be formed. Here, the second insulating layer 130 may be formed by applying and then hardening a fluid synthetic resin containing a core material. Here, the electronic component 10 may be more stably fixed by the second insulating layer 130.

Then, a first insulating layer 120 including a cavity 121 may be coupled onto the second insulating layer 130.

In addition, a third upper insulating layer 141 covering the first insulating layer 120 and the electronic component 10 may be formed. Here, the third upper insulating layer 141 is formed, such that the electronic component 10 may be completely closed in the multilayered substrate.

Figure 6F:
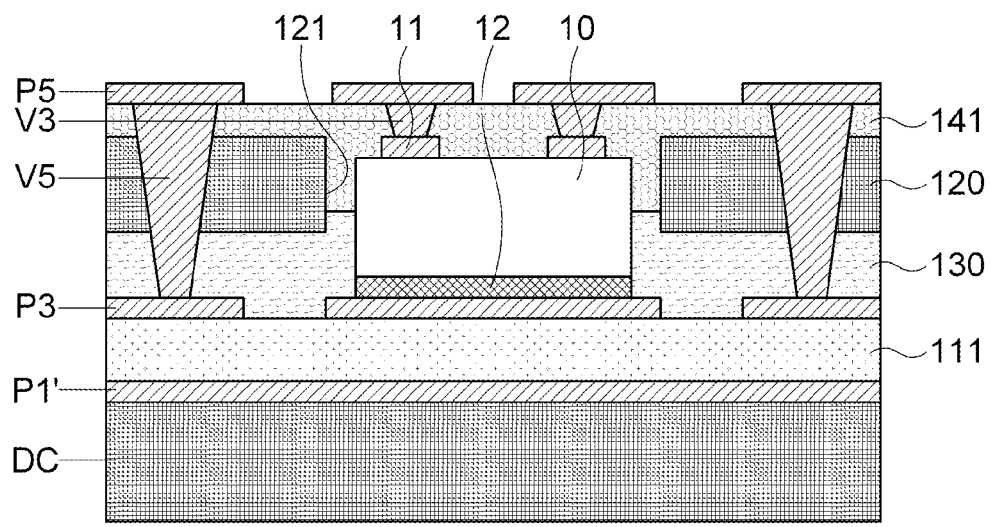

Next, referring to FIG. 6F, after a fifth via V5 penetrating through the third upper insulating layer 141, the first insulating layer 120, and the second insulating layer 130 and a third via V3 penetrating through the third insulating layer 141 are formed, a fifth circuit pattern layer P5 may be formed. Here, the third via V3 may directly connect any one circuit pattern of the fifth circuit pattern layer P5 and an external electrode 11 to each other, and the fifth via V5 may directly connect any one circuit pattern of the fifth circuit pattern layer P5 and any one circuit pattern of the third circuit pattern layer P3 to each other.

Figure 6G:
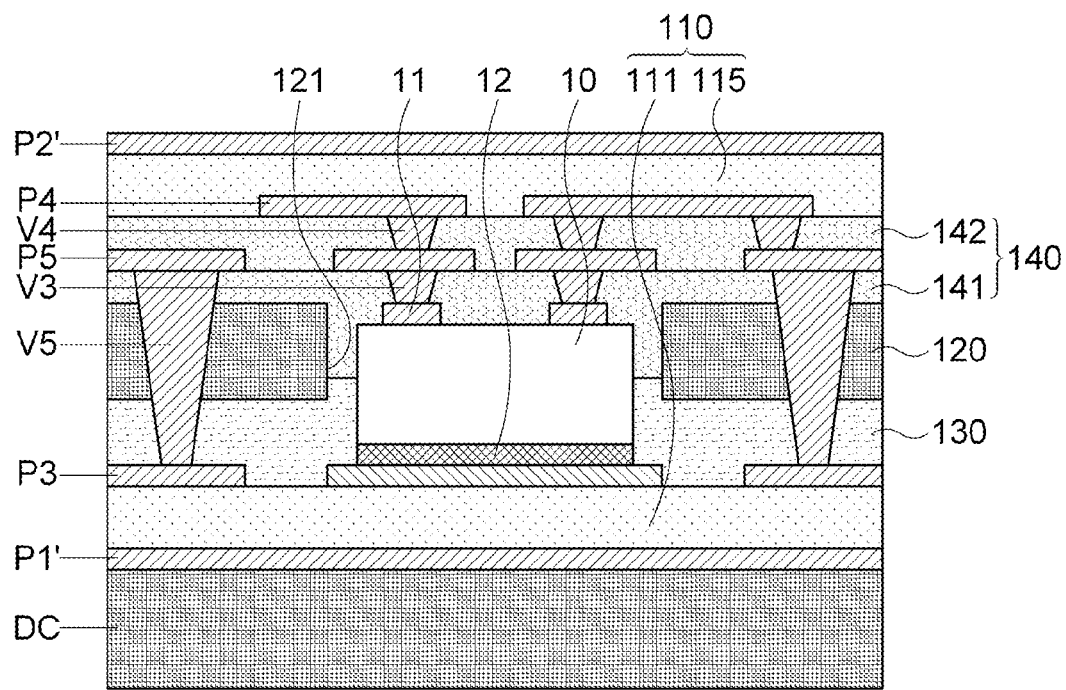

Then, referring to FIG. 6G, after a third lower insulating layer 142 is formed on the third upper insulating layer 141, a fourth via V4 and a fourth circuit pattern layer P4 may be formed and a second reinforcing layer 115 may be formed.

Figure 6H:
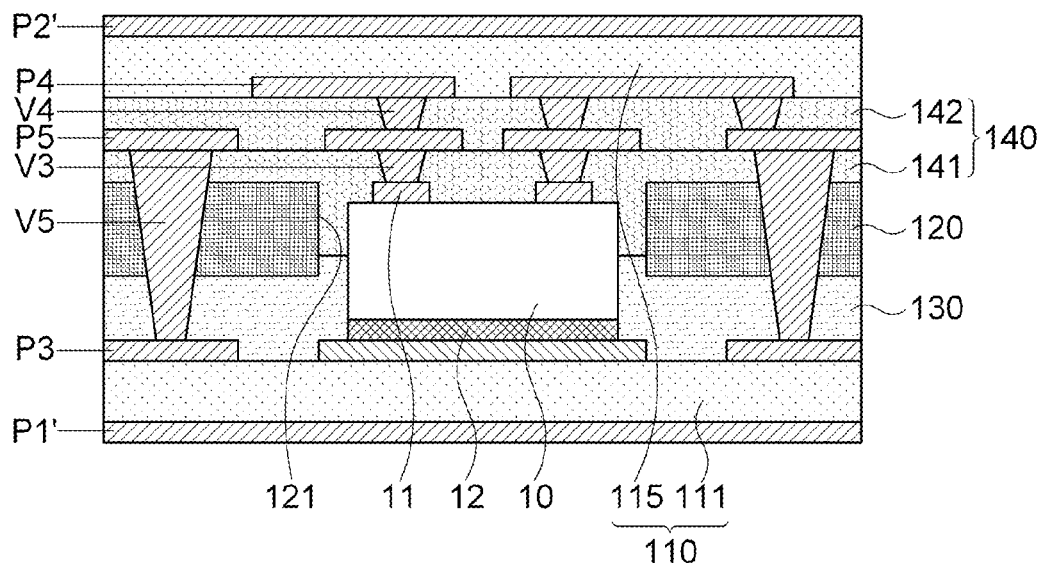

Next, referring to FIG. 6H, the detached core DC coupled to a lower surface of the first metal layer P1' may be removed.

Figure 6I:
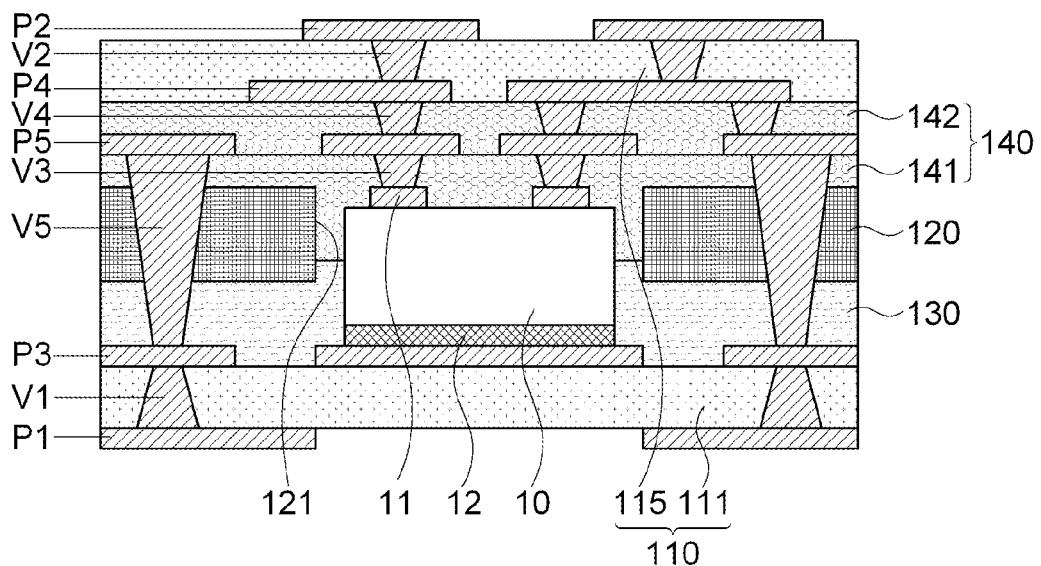

Then, referring to FIG. 6I, first and second circuit pattern layers P1 and P2 may be formed on the first and second metal layers P1' and P2', respectively.

Figure 6J:
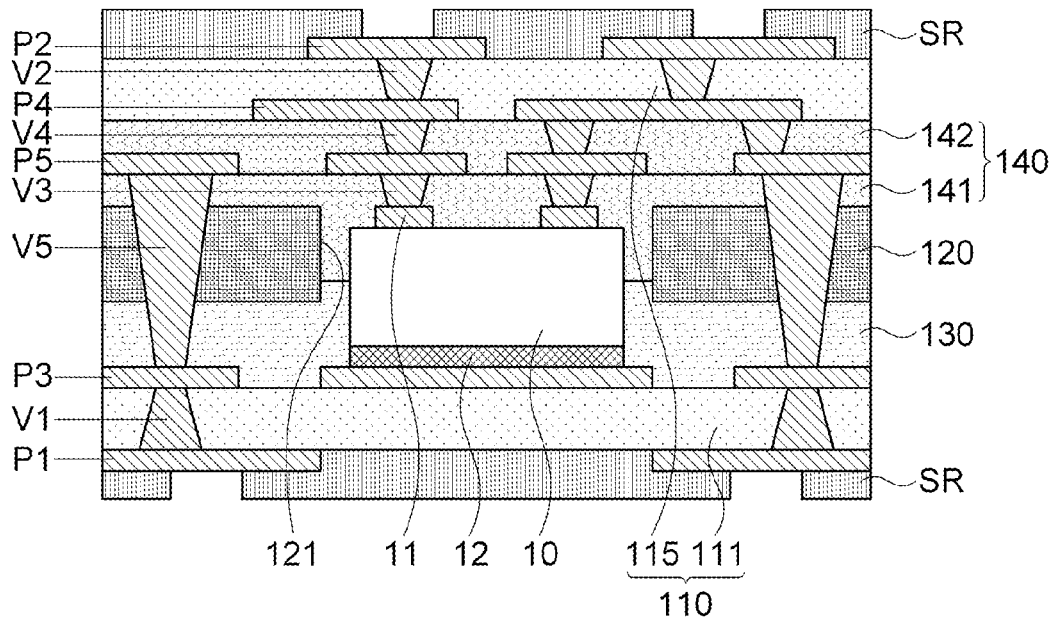
Figure 6K:
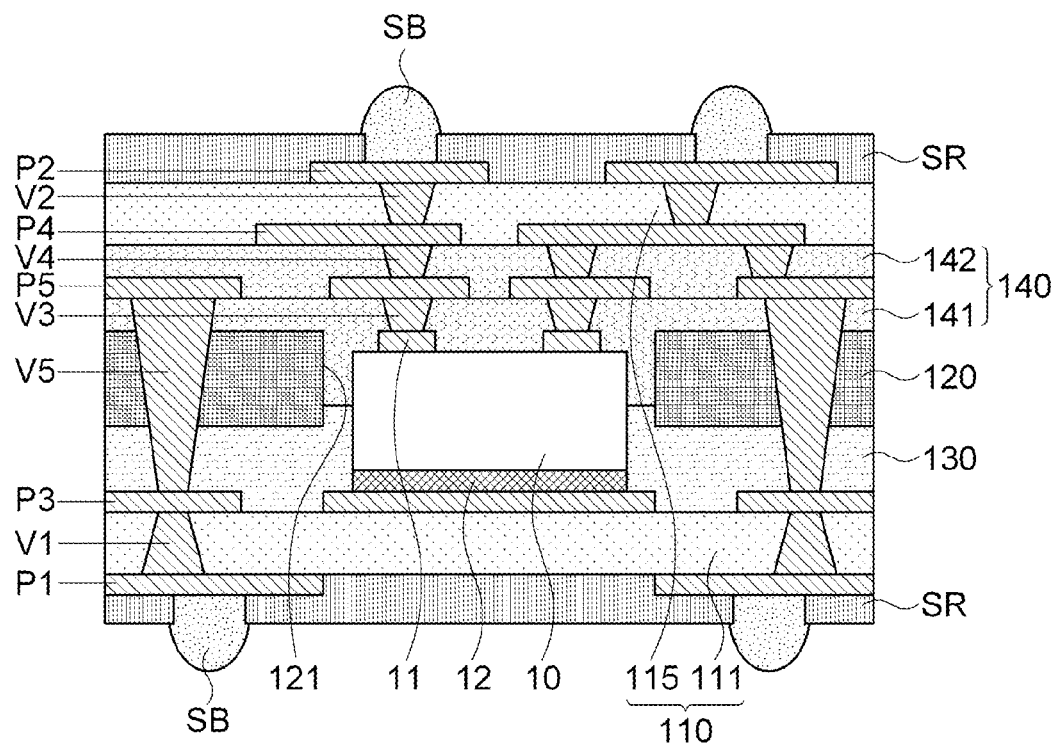
Figure 7A:
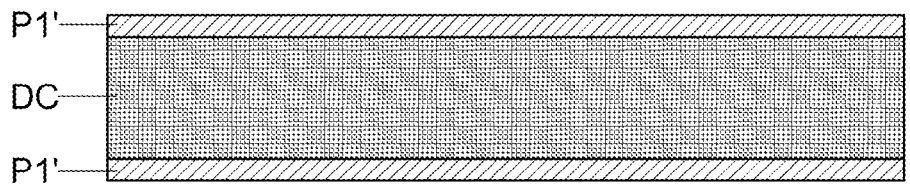
FIGS. 7A to 7K are views schematically showing processes of a method of manufacturing a multilayered substrate according to another exemplary embodiment of the present invention, wherein FIG. 7A schematically shows the state in which a detached core having first metal layers disposed on both surfaces thereof, respectively, is provided.
Figure 7B:
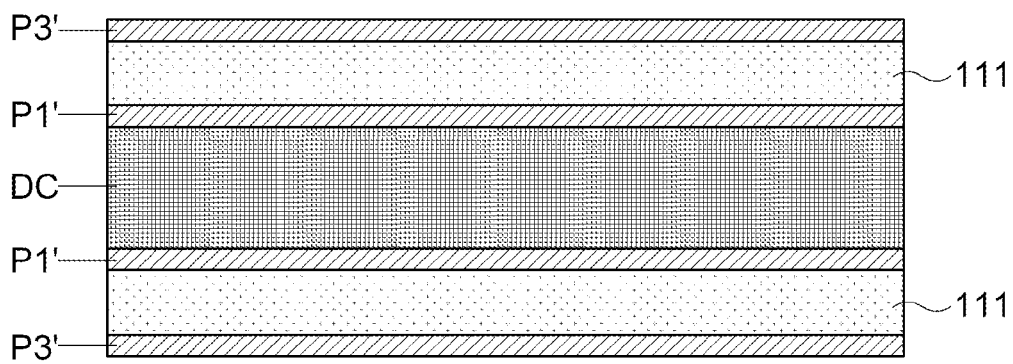
Figure 7C:
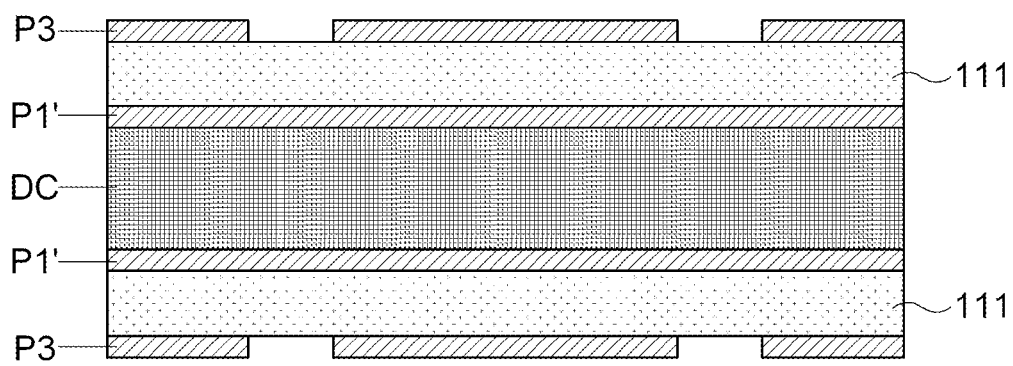
Figure 7D:
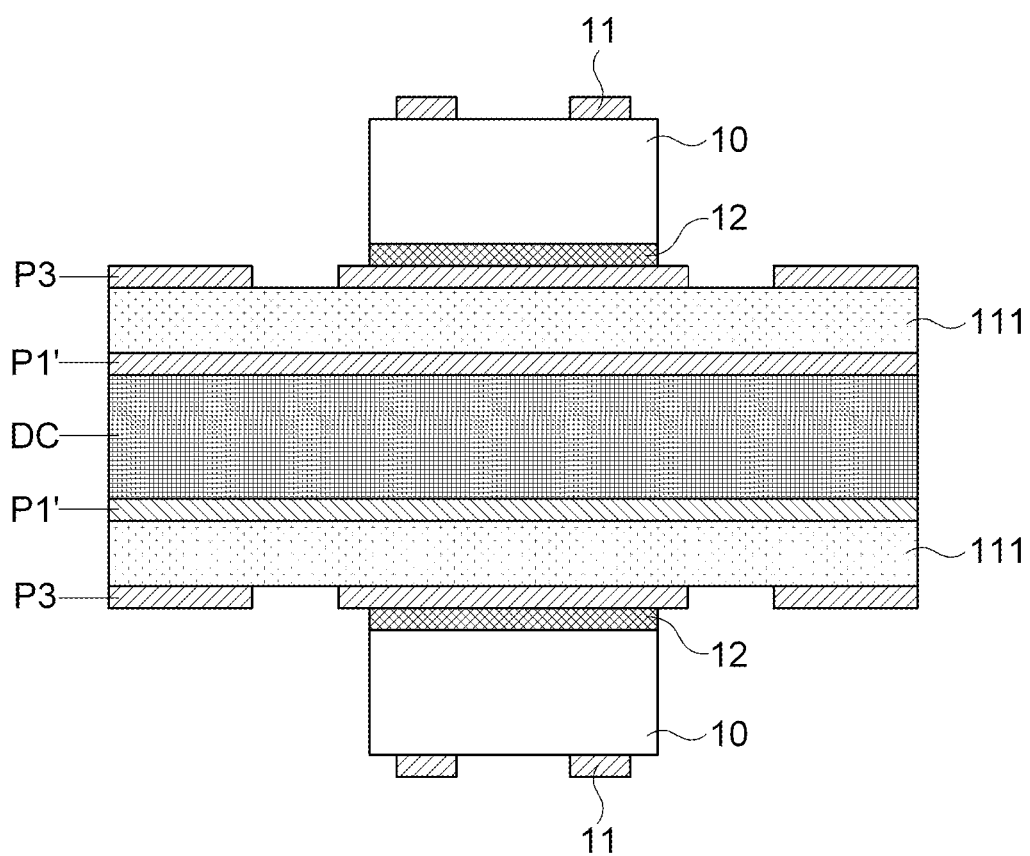
Figure 7E:
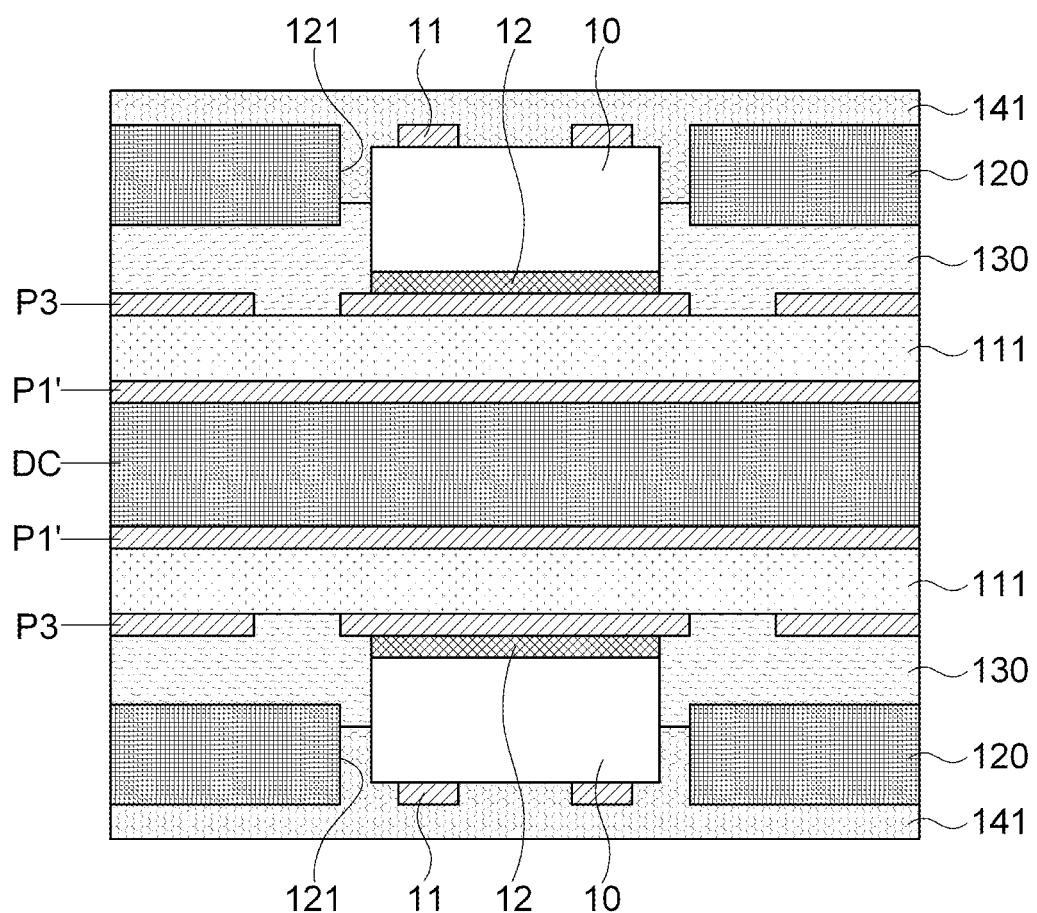
Figure 7F:
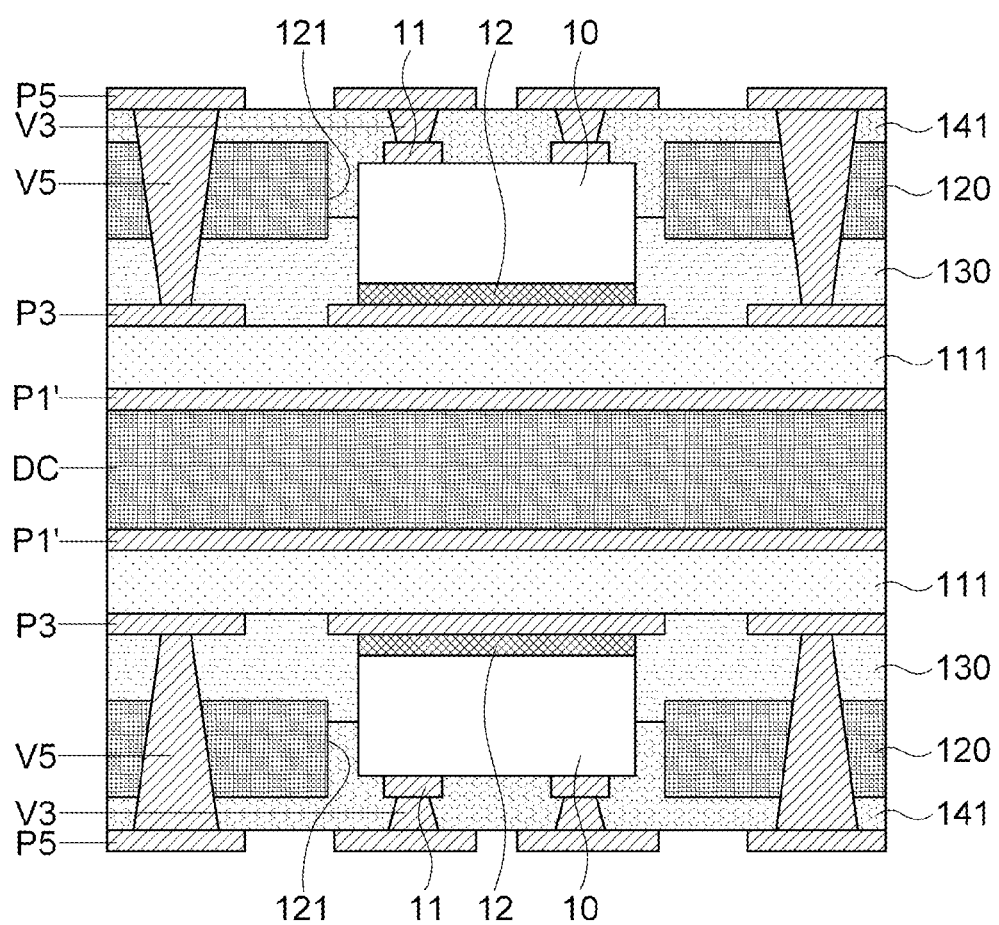
Figure 7G:
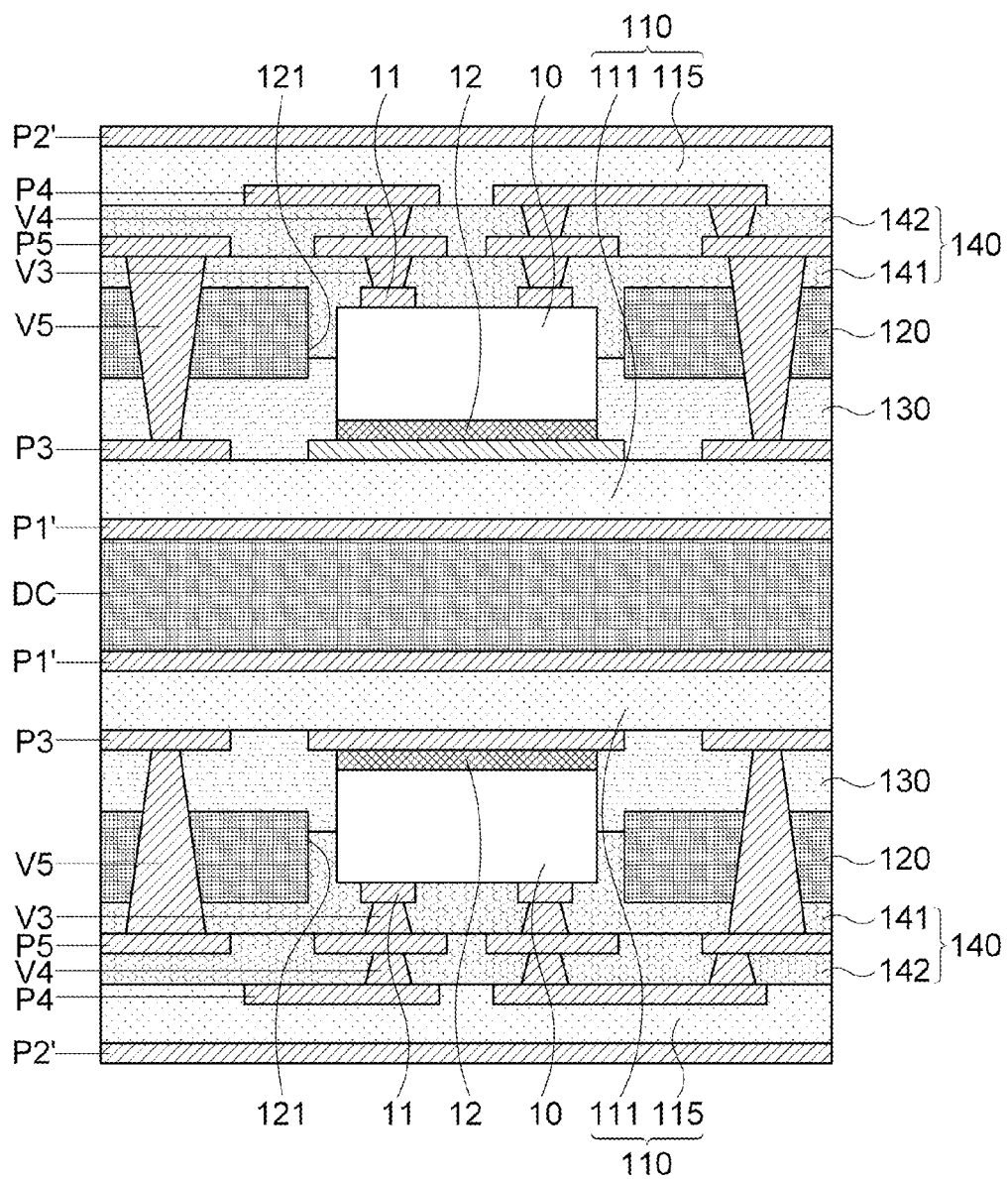
Figure 7H:
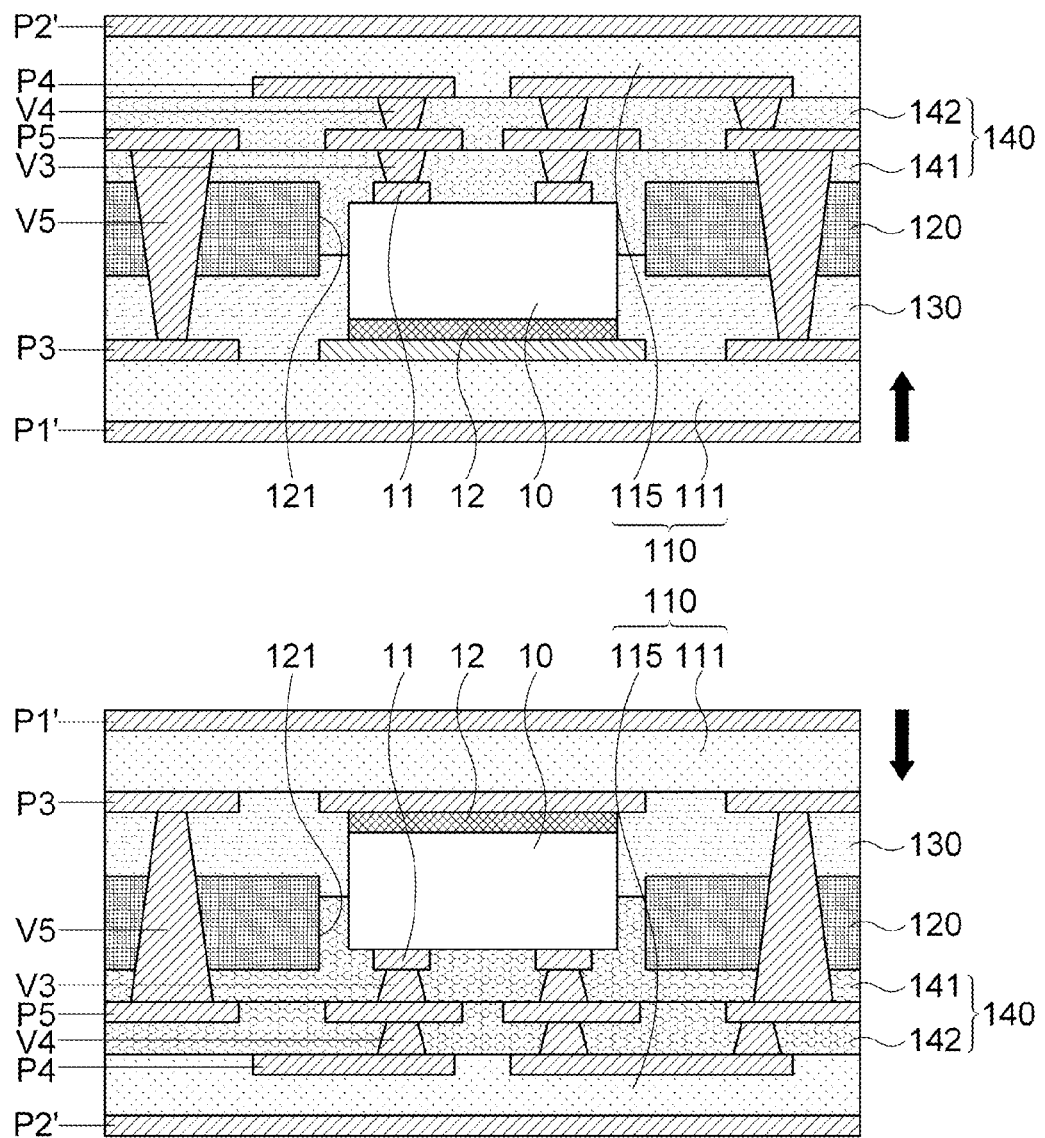
Figure 7I:
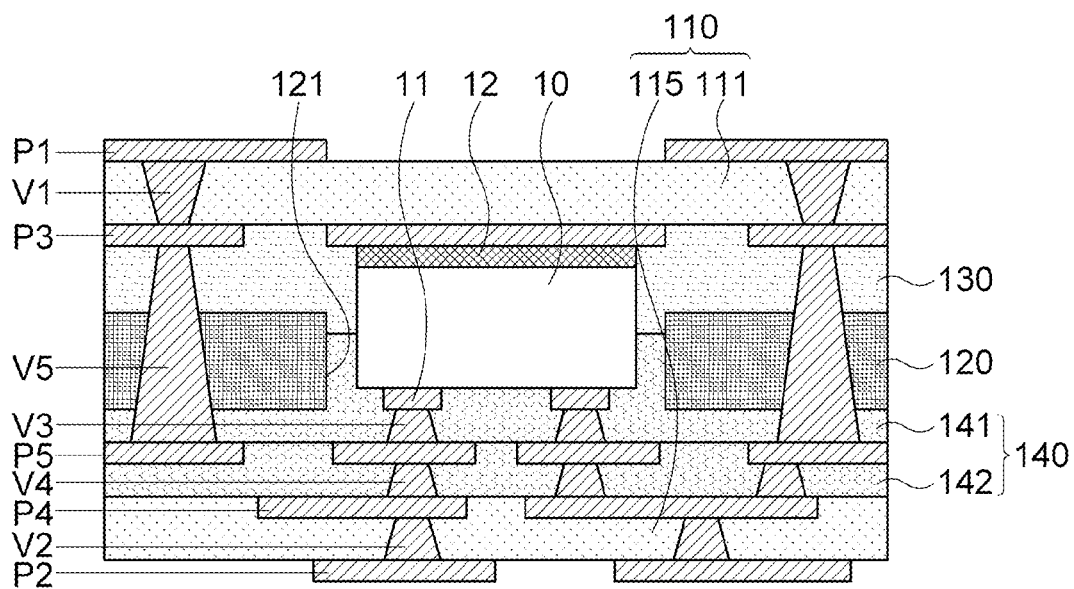
Figure 7J:
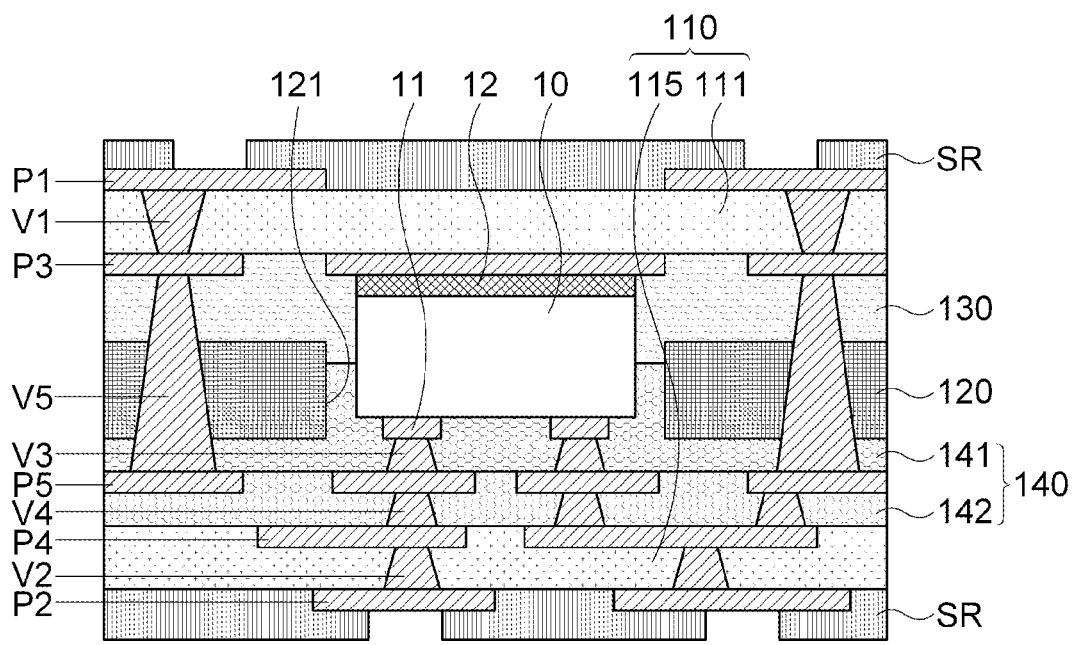
Figure 7K:
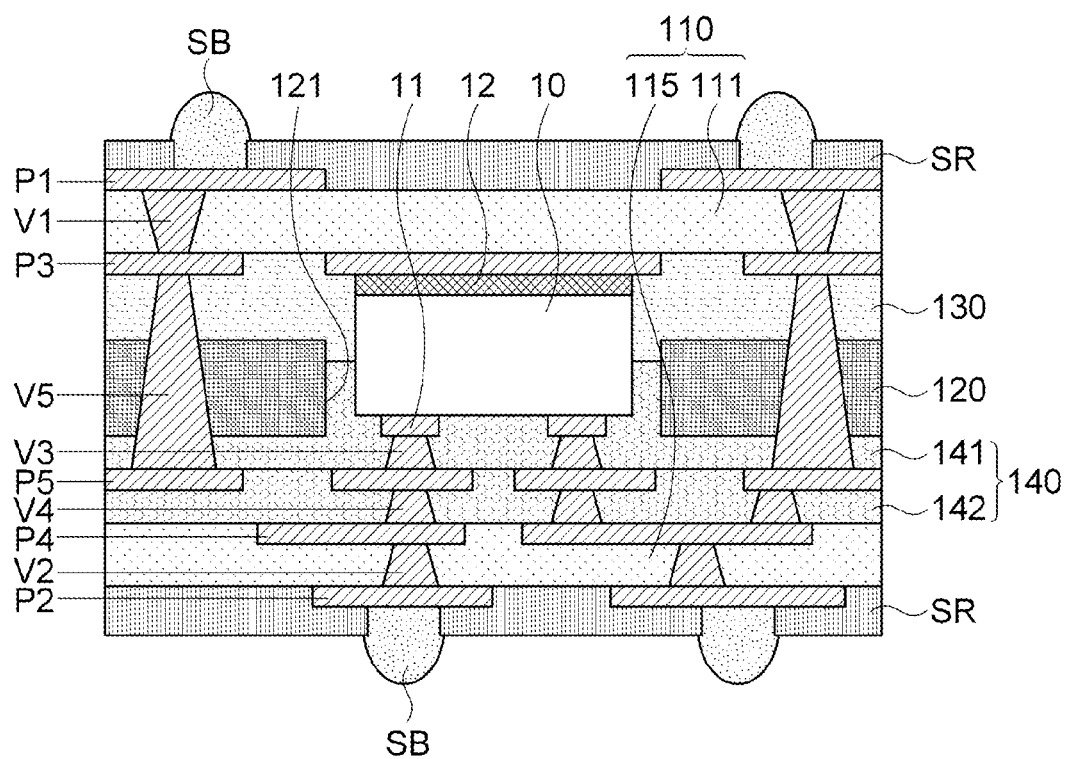

Next, referring to FIGS. 6J and 6K, after solder resists SR are formed on the first and second circuit pattern layers P1 and P2, solder balls SB may be formed.

Meanwhile, the first and second reinforcing layers 111 and 115 are made of a material having a coefficient of thermal expansion less than 11 ppm/° C. or an elastic modulus of 25 GPa or more as described above, thereby making it possible to decrease warpage. Here, as a material of the first and second reinforcing layers 111 and 115, a glass material may be used.

FIGS. 7A to 7K are views schematically showing processes of a method of manufacturing a multilayered substrate 100 according to another exemplary embodiment of the present invention, which is more advantageous for decreasing warpage since the respective layers are symmetrically formed on both surfaces of the detached core DC, unlike the method shown in FIGS. 6A to 6K.

According to the exemplary embodiment of the present invention configured as described, warpage of the multilayered substrate may be decreased.

In addition, according to the exemplary embodiment of the present invention, wiring patterns are optimized depending on a scheme in which external electrodes are formed on an electronic component, thereby making it possible to improve manufacturing efficiency and decrease warpage.

Since remaining contents are similar to the contents described in the above-mentioned exemplary embodiment, an overlapped description will be omitted.

What is claimed is:

1. A multilayered substrate comprising:
a wiring layer; and
a reinforcing layer disposed at a substantially outermost surface of the multilayered substrate, configured to decrease warpage of the multilayered substrate, the reinforcing layer being substantially devoid of fiber.

2. The multilayered substrate according to claim 1, wherein the reinforcing layer comprises a material having a coefficient of thermal expansion of about 11 ppm/° C. or less.

3. The multilayered substrate according to claim 1, wherein the reinforcing layer comprises a material having an elastic modulus of about 25 GPa or more.

4. The multilayered substrate according to claim 1, wherein the reinforcing layer comprises a material having a coefficient of thermal expansion of about 11 ppm/° C. or less and an elastic modulus of about 25 GPa or more.

5. The multilayered substrate according to claim 1, wherein the reinforcing layer is made of a glass material.

6. The multilayered substrate according to claim 1, wherein the reinforcing layer disposed at the outermost portion of one surface of the multilayered substrate is a first reinforcing layer, a reinforcing layer disposed at the outermost portion of the other surface of the multilayered substrate is a second reinforcing layer, and the multilayered substrate further comprises a first insulating layer disposed between the first and second reinforcing layers, the first insulating layer including an electronic component having an external electrode and a cavity into which at least a portion of the electronic component is inserted.

7. The multilayered substrate according to claim 6, further comprising a solder resist covering at least a portion of at least one of one surface of the first reinforcing layer and the other surface of the second reinforcing layer.

8. The multilayered substrate according to claim 6, further comprising: a third circuit pattern layer disposed on a lower surface of the first reinforcing layer; and a second insulating layer disposed between the first reinforcing layer and the first insulating layer, wherein the second insulating layer contacts the lower surface of the first reinforcing layer and the third circuit pattern layer.

9. The multilayered substrate according to claim 8, further comprising a third insulating layer disposed between the first insulating layer and the second reinforcing layer, wherein the third insulating layer includes a fourth circuit pattern layer disposed on a portion of a surface thereof and contacting the second reinforcing layer.

10. The multilayered substrate according to claim 9, wherein the third insulating layer includes: a third upper insulating layer contacting the first insulating layer and a surface of the electronic component and having a fifth circuit pattern layer disposed on a lower surface thereof; and a third lower insulating layer having one surface contacting the fourth circuit pattern layer and the second reinforcing layer.

11. The multilayered substrate according to claim 10, further comprising a fifth via penetrating through the second insulating layer, the first insulating layer, and the third upper insulating layer and directly connecting at least one circuit pattern of the third circuit pattern layer and at least one circuit pattern of the fifth circuit pattern layer to each other.

12. The multilayered substrate according to claim 10, further comprising a third via penetrating through the third upper insulating layer and directly connecting at least one circuit pattern of the fifth circuit pattern layer and the external electrode to each other.

13. A method of manufacturing a multilayered substrate, comprising: forming a reinforcing layer at a substantially outermost surface of the multilayered substrate including a wiring layer, wherein the reinforcing layers are substantially devoid of fiber, configured to reduce warpage, and made of a material satisfying at least one of a condition in which a coefficient of thermal expansion is about 11 ppm/° C. or less or a condition in which an elastic modulus is about 25 GPa or more, or combinations thereof.

14. The method according to claim 13, wherein the reinforcing layer is made of a glass material.

15. A method of manufacturing a multilayered substrate, comprising:
mounting an electronic component on a first reinforcing layer having a third circuit pattern layer formed on one surface thereof, the electronic component having an external electrode;
forming a second insulating layer on the first reinforcing layer, the second insulating layer covering the third circuit pattern layer and the first reinforcing layer and contacting a side of the electronic component;
stacking a first insulating layer on the second insulating layer, the first insulating layer having a cavity into which at least a portion of the electronic component is inserted;
forming a third upper insulating layer on the first insulating layer, the third upper insulating layer covering the electronic component and the first insulating layer and being filled between the cavity and the electronic component;
forming a fifth circuit pattern layer on the third upper insulating layer, the fifth circuit pattern layer having at least one circuit pattern directly connected to the external electrode by a third via;
forming a third lower insulating layer on the third upper insulating layer, the third lower insulating layer covering the fifth circuit pattern layer and the third upper insulating layer;
forming a fourth circuit pattern layer on the third lower insulating layer, the fourth circuit pattern layer having at least one circuit pattern directly connected to at least one circuit pattern of the fifth circuit pattern layer by a fourth via; and forming a second reinforcing layer on the third lower insulating layer, the second reinforcing layer covering the fourth circuit pattern layer and the third lower insulating layer, wherein the first and second reinforcing layers are substantially devoid of fiber and decrease warpage of the multilayered substrate.

16. The method according to claim 15, wherein the first and second reinforcing layers comprise a material satisfying at least one of a condition in which a coefficient of thermal expansion is about 11 ppm/° C. or less or a condition in which an elastic modulus is about 25 GPa or more, or combinations thereof.

17. The method according to claim 16, wherein the first and second reinforcing layers are made of a glass material.

18. The method according to claim 16, wherein the first reinforcing layers are formed on upper and lower surfaces of a detached core, respectively, and are separated from the detached core after the method is performed in each of directions toward upper and lower surfaces based on the detached core.

19. The method according to claim 16, wherein the third upper insulating layer and the third lower insulating layer are formed by hardening a fluid synthetic resin that does not contain a core material.

20. The method according to claim 16, wherein the second insulating layer is formed by hardening a fluid synthetic resin that contains a core material.

21. The method according to claim 16, wherein the forming of the fifth circuit pattern layer on the third upper insulating layer includes forming a fifth via directly connecting at least one circuit pattern of the fifth circuit pattern layer to at least one circuit pattern of the third circuit pattern layer.

* * * * *